United States Patent
Huerner et al.

(10) Patent No.: US 10,325,984 B2
(45) Date of Patent: Jun. 18, 2019

(54) MONOLITHICALLY INTEGRATED SEMICONDUCTOR SWITCH, IN PARTICULAR A POWER CIRCUIT BREAKER

(71) Applicant: FRAUNHOFER-GESELLSCHAFT ZUR FOERDERUNG DER ANGEWANDTEN FORSCHUNG E.V., Munich (DE)

(72) Inventors: Andreas Huerner, Nuremberg (DE); Tobias Erlbacher, Poxdorf (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 16/048,474

(22) Filed: Jul. 30, 2018

(65) Prior Publication Data
US 2019/0043852 A1 Feb. 7, 2019

(30) Foreign Application Priority Data
Aug. 3, 2017 (DE) .......... 10 2017 213 489

(51) Int. Cl.
*H02H 3/08* (2006.01)
*H01L 27/06* (2006.01)
(Continued)

(52) U.S. Cl.
CPC ...... *H01L 29/0843* (2013.01); *H01L 27/0248* (2013.01); *H01L 27/0623* (2013.01);
(Continued)

(58) Field of Classification Search
CPC ............. H01L 29/0692; H01L 29/0843; H01L 29/1608; H01L 29/6606; H01L 29/66068;
(Continued)

(56) References Cited

U.S. PATENT DOCUMENTS

| 2014/0361349 A1 | 11/2014 | Alexandrov et al. ................ H01L 29/8083 |
| 2017/0133841 A1 | 5/2017 | Coyne .................... H02H 9/046 |
| 2017/0323884 A1 | 11/2017 | Huerner et al. .... H01L 27/0705 |

FOREIGN PATENT DOCUMENTS

| CN | 103 280 458 B | 7/2015 | ............. H01L 29/78 |

OTHER PUBLICATIONS

Rosensaft et al.; *Circuit Breaker and Safe Controlled Power Switch*; Proc. of the 19th International Symposium on Power Semiconductor Devices & Ics; Korea; May 27-30, 2007; pp. 169-172.
(Continued)

*Primary Examiner* — Robert G Bachner
*Assistant Examiner* — Molly K Reida
(74) *Attorney, Agent, or Firm* — Renner Kenner Greive Bobak Taylor & Weber

(57) ABSTRACT

In a semiconductor switch with a monolithically integrated field effect transistor, the source or emitter region of the field effect transistor is connected via a semiconductor region and an n-doped contact region to a first electrical terminal. In the semiconductor region, a semiconductor structure with n-doped channels is formed between the n-doped contact region and the source or emitter region of the field effect transistor; the n-doped channels electrically connect the n-doped contact region with the source or emitter region of the field effect transistor and run between p-doped regions that are connected to the n-doped contact region. The semiconductor switch is suitable as a self-switching load disconnector and has low losses in the switched-on state.

11 Claims, 4 Drawing Sheets

(51) Int. Cl.
*H01L 29/16* (2006.01)
*H01L 29/78* (2006.01)
*H01L 29/739* (2006.01)
*H01L 29/808* (2006.01)
*H01L 29/36* (2006.01)
*H01L 29/08* (2006.01)
*H01L 29/66* (2006.01)
*H01L 27/02* (2006.01)
*H01L 29/06* (2006.01)
*H01L 29/10* (2006.01)

(52) U.S. Cl.
CPC ...... *H01L 27/0629* (2013.01); *H01L 29/0603* (2013.01); *H01L 29/0607* (2013.01); *H01L 29/0692* (2013.01); *H01L 29/0856* (2013.01); *H01L 29/0865* (2013.01); *H01L 29/0869* (2013.01); *H01L 29/1058* (2013.01); *H01L 29/1608* (2013.01); *H01L 29/66068* (2013.01); *H01L 29/7802* (2013.01); *H01L 29/8083* (2013.01); *H02H 3/08* (2013.01); *H01L 29/7393* (2013.01); *H01L 29/78* (2013.01); *H01L 29/808* (2013.01)

(58) Field of Classification Search
CPC ............... H01L 29/808; H01L 29/8083; H01L 29/0856–0869; H01L 29/7802; H01L 29/66666; H01L 29/66712
See application file for complete search history.

(56) References Cited

OTHER PUBLICATIONS

Callavik et al.; *The Hybrid HVDC Breaker an innovation breakthrough enabling reliable HVDC grids*; ABB Grid Systems, Technical Paper; Nov. 2012.

Huerner et al.: *Monolithically Integrated Solid-State-circuit-Breaker for High Power Applications*; Materials Science Forum; BD. 897, May 2007; pp. 661-664.

Albrecht et al.; *Experimental Verification of a Self-Triggered Solid-State Circuit Breaker Based on a SiC BIFET*; Material Science Forum; Bd. 897; May 2017; pp. 665-668.

European Search Report dated Dec. 13, 2018 in related application No. EP 18 18 5156.

MONOLITHICALLY INTEGRATED SEMICONDUCTOR SWITCH, IN PARTICULAR A POWER CIRCUIT BREAKER

TECHNICAL FIELD OF APPLICATION

The present invention relates to a monolithically integrated semiconductor switch, in particular a power circuit breaker, with a monolithically integrated field effect transistor, in which a source or emitter region of the field effect transistor is electrically connected with a first electrical terminal, and a drain or collector region of the field effect transistor is electrically connected with a second electrical terminal of the semiconductor switch.

Semiconductor switches are used as power circuit breakers, for example, for purposes of limiting and switching-off an excess current in an electrical network. When a short circuit occurs within an electrical network, the load current is limited only by the impedance of the network. The result is an excess current, resulting in a significant thermal loading on the connected loads. To avoid any resulting damage to these loads, a rapid limitation and switch-off of the excess current is required, in the course of which, inter alia, the ignition of electric arcs should also be avoided.

PRIOR ART

In power transmission technology, this problem has hitherto typically been solved by the use of mechanical power circuit breakers. These power circuit breakers are used to switch operating currents on and off, and also to switch off short-circuit currents in the event of a fault. In normal operation, they must both administer all operating currents and withstand the thermal and dynamic stresses that thereby occur. In the event of a short circuit the power circuit breaker must switch off the current path as abruptly and safely as possible, so that downstream equipment is not damaged or destroyed. Here the separation point must form an insulating gap between the adjacent conductors that is proof against breakdown.

In mechanical power circuit breakers, the breaker parts are separated from one another by way of a mechanical lever in the event of a malfunction. The current density in the contact area becomes so great that a fusible bridge is formed. The resulting electric arc between the contacts initially keeps the circuit closed. In the case of alternating current, the electric arc extinguishes as it passes through zero voltage. However, in order that the electric arc does not re-ignite as the voltage rises again, the arc gap must be deionised. This is achieved by cooling the electric arc by means of an extinguishing agent such as, for example, $SF_6$, or by means of a vacuum. The switching process can last for a number of cycles. During the switch-off process the current increases rapidly and, depending on the switch-off duration, progressively approaches the amplitude of the surge current. The magnitude of the amplitude depends on the network structure and the short-circuit power that is available in the latter. The total time from detection to complete separation of the current path can last well over 100 ms. Within this period, the excess current flows through the downstream equipment, which for this reason must also be dimensioned for this excess current. To reduce the excess current loading, the power circuit breaker should provide a more rapid switch-off. However, too rapid a switching process in mechanical power circuit breakers increases the intensity of the electric arc, as a result of which additional energy is required to extinguish the latter, and the wear of the contacts progresses further. It is therefore difficult to achieve short switching times with mechanical switches.

Another option for solving the above problem is the use of semiconductor-based power circuit breakers. These switches are able to switch off in a few microseconds. In addition, they do not form an electric arc, so that no additional extinguishing agent is needed. As a result of the lack of moving parts, they are low wear and low maintenance and also save space, thanks to their compact design. Basically, such a power circuit breaker consists of a plurality of individual components connected in parallel or in series, in particular thyristors, GTOs and IGBTs. Since power circuit breakers in this application are mainly operated in the "on" state, switching losses and blocking properties can be disregarded to a first approximation. Consequently, IGBTs are unsuitable because of their significantly higher forward losses compared to thyristors. Thyristors seem to be better suited by virtue of their low forward losses and are available for blocking voltages up to 8 kV. Firing is effected by a low gate current or by a light pulse. For purposes of extinction the current must fall below a certain holding current level. In the case of alternating current this takes place automatically when the current passes through zero. However, a certain recovery time must be maintained, in which the remaining charge carriers are removed from the space charge zone. This can take up to several 100 µs. During this time, the renewed rise in the voltage must be limited, since otherwise the thyristor is spontaneously refired. However, the recovery time is increased if the forward current increases or the temperature rises. It should also be noted that the thyristor requires a continuous firing signal due to the zero crossing. In contrast, gate turn-off thyristors (GTOs) can be switched off by a reverse control current. However, this cannot be achieved solely by the internal design of the semiconductor; instead it requires an additional RCD circuit so as to limit the renewed rise of the voltage during the switch-off process. The problem with such power circuit breakers is that there is no electrical isolation in the blocking mode of operation. Even in blocking mode, low blocking currents in the mA range continue to flow.

From M. Callavik et al., "The Hybrid HVDC Breaker. ABB Grid System", Technical Paper November 2012, a hybrid power switch for DC power transmission is of known art. Here this takes the form of a parallel circuit with a bypass and the electrical power circuit breaker constructed of power semiconductors, which forms the main switch. In normal operation, the current flows through the bypass. The latter consists of a rapid-switching mechanical power switch and a commutator. In the event of a malfunction, the commutator causes an increase in the line resistance, so that the current commutates to the main current path. The commutator is implemented in the form of series-connected IGBTs, which increase the line resistance by altering the gate voltage. After a short time delay, the mechanical switch opens. The current is now interrupted by the main switch. The entire switch-off process takes less than 5 ms. However, the whole design is very complex and expensive.

The complex design of the power circuit breakers represents a fundamental problem of the solution concepts described above. It requires extensive control electronics, which ultimately lead to a limitation in the reliability of the overall system.

From B. Rosensaft et al., Power circuit breaker and Safe Controlled Power Switch, Proc. of the 19th International Symposium on Power Semiconductor Devices & ICs, Korea 2007, pp. 169-172, a monolithically integrated power circuit breaker with an n-JFET and a p-JFET is of known art, which is based on the principle of the so-called dual thyristor. In this circuitry, the source electrodes of both JFETs are shorted together, the gate electrode of the p-JFET is shorted to the anode terminal, and the gate electrode of the n-JFET is shorted to the cathode terminal. In analogy to a thyristor that maintains a high current flow with low forward voltage after overhead firing, the dual thyristor can maintain a high blocking voltage with minimum blocking current after it has been activated. Whereas the latching thyristor is extinguished when the voltage passes through zero, the (re) switching on of the dual thyristor, also known by the term SSCB (Solid State Circuit Breaker), is effected when the current passes through zero. In contrast to the thyristor, in the case of the SSCB overhead blocking by means of excess current is possible, instead of overhead firing as a result of an excessive blocking voltage. Thus, this component can be used as a self-activating resettable security element in the event of short circuits and excess currents in electrical energy transmission. The phase current normally flows through the low-resistance power circuit breaker. In the event of a fault, the power circuit breaker switches to a high-ohmic state within a few 100 µs and permanently absorbs the full phase voltage (until reset).

However, in such a power component, the maximum cathode voltage is limited by the blocking resistance of the gate electrode of the n-JFET, and the maximum anode voltage is limited by the blocking resistance of the gate electrode of the p-JFET. Thus, a power circuit breaker designed in this manner is only suitable for low operating voltages, especially in the case of a monolithic integration. Here the gate potentials of the JFETs are driven exclusively via semiconductor regions, so that external control via the gate electrodes is not possible. In the cited publication of Rosensaft et al., modifications of such a power circuit breaker for higher operating voltages are also shown; these are based essentially on the process technology of the MOS-based IGBT with a monolithically integrated n-channel MOSFET.

In the later published DE 10 2016 207 859 a monolithically integrated semiconductor switch with regenerative switch-off behaviour is described, which can be used as a power circuit breaker or a load disconnector, even at high operating voltages, and allows rapid automatic switch-off of excess currents. This semiconductor switch consists of two field effect transistors whose control principle, for at least one of the field effect transistors, corresponds to the control principle of a JFET. Here the source or emitter electrode of the first field effect transistor is shorted to the source or emitter electrode of the second field effect transistor. The drain or collector electrode of the first field effect transistor is connected to a first electrical terminal of the semiconductor switch; the drain or collector electrode of the second field effect transistor is connected to a second electrical terminal of the semiconductor switch. The well region of the second field effect transistor is shorted to the two source or emitter electrodes of the two field effect transistors. The well region of the first field effect transistor is shorted to the second electrical terminal. The channel region of the field effect transistors lies between the gate electrode and the well region in each case. For this semiconductor switch, however, at least one JFET with a p-doped channel region is required. Thus a relatively high "on"-resistance, and with it very high losses in normal operation, is to be expected, due to the low conductivity of p-doped layers.

The object of the present invention is to specify a semiconductor switch that can be used as a power circuit breaker or a load disconnector, even at high operating voltages, allows rapid automatic switch-off in the event of excess currents, and has low forward losses in normal operation.

PRESENTATION OF THE INVENTION

The object is achieved with the monolithically integrated semiconductor switch in accordance with claim 1. Advantageous embodiments of the semiconductor switch are the subject matter of the dependent claims, or can be found in the following description together with the embodiments.

In the proposed semiconductor switch with a monolithically integrated field effect transistor, the source or emitter region of the field effect transistor is electrically connected via a semiconductor region and an n-doped contact region to a first electrical terminal, and the drain or collector region of the field effect transistor is electrically connected to a second electrical terminal, of the semiconductor switch. In the semiconductor region between the n-doped contact region and the source or emitter region of the field effect transistor in the proposed semiconductor switch, is designed a semiconductor structure with n-doped channels, which electrically connect the n-doped contact region with the source or emitter region of the field effect transistor, and run between p-doped regions that are connected to the n-doped contact region, preferably via an ohmic connection.

In this design of the semiconductor switch, the semiconductor structure forms a current-dependent series resistance for the field effect transistor between the n-doped contact region and the source or emitter region of the field effect transistor. In normal operation, the current flows from the n-doped contact region to the source or emitter region of the field-effect transistor and is thus exclusively determined by the current between the two electrical terminals, i.e. by the voltage applied between anode and cathode, and by the resistance of the n-doped channels. Due to the high conductivity of n-doped regions in comparison with the conductivity of p-doped layers, a significant reduction in the "on"-resistance and the losses in normal operation is achieved compared with the semiconductor switch of DE 10 2016 207 859. However, currents above the rated current result in an additional voltage drop across the n-doped channels. This leads to a pinch-off of these channels by a space charge zone and thereby to an increase in the resistance of these channels. Ultimately, this increase in resistance results in a complete pinch-off of the n-doped channel region of the JFET, given a sufficiently high resistance. Thus, the entire semiconductor switch is switched off at an appropriately high anode and cathode voltage and thus fulfils the task as a load disconnector or power circuit breaker.

In an advantageous development of the proposed semiconductor switch, the p-doped regions of the semiconductor structure are ohmically connected via an ohmic connection to the source or emitter region. By this means, in normal operation the current can also flow through the p-regions of the semiconductor structure in order to increase further the current-carrying capacity of the semiconductor switch. This ohmic connection as well as the preferably ohmic connection to the n-doped contact region may be designed in different ways, either in the form of a plurality of separate connections, or as a continuous connection strip that runs transverse to the n-doped channels. The ohmic connection is formed by a metallisation. In the case of the ohmic connection to the n-doped contact region, this connection can also be formed by an extension of the metallisation of the cathode.

The n-doped channels do not necessarily have to run parallel to one another, or have a constant cross section. They can, for example, also expand in the direction of the n-doped contact region, i.e. they can enlarge their cross section.

The semiconductor switch preferably has an n-JFET as a monolithically integrated field-effect transistor. In principle, however, other field-effect transistors, such as a normally conducting or non-conducting p-channel MOSFET or a BIFET, are possible. In the case of the BIFET, the semiconductor switch has a p-type substrate instead of the n-type substrate in the case of the n-JFET. By using a p-doped collector region in the case of the BIFET, additional charge carriers are injected into the drift region in the switched-on state. By this means, low static losses can be achieved even with very high blocking resistances.

In the proposed semiconductor switch, the field effect transistor is preferably monolithically integrated in a semiconductor substrate made of silicon or silicon carbide. The use of silicon carbide affords the possibility of implementing semiconductor components for operation at high blocking voltages, so that applications of the proposed semiconductor switch at the medium-voltage level (10 kV or 20 kV) and in HVDC technology also become possible. Whereas at the medium voltage level a functionality must be provided for alternating voltage (with polarity change), HVDC technology only requires operation with one polarity. In contrast to mechanical circuit breakers, the proposed semiconductor switch has, in particular, a high activation speed.

By virtue of the monolithic integration of a voltage-dependent series resistance in the proposed semiconductor switch, the current flow via the semiconductor switch can be automatically switched off if a certain anode voltage or a certain anode current is exceeded. Additional control and monitoring electronics are not required for this purpose. The limits for the anode voltage and the anode current can be determined by the dimensioning of the individual semiconductor regions. When implemented with a separately controllable gate electrode, instead of an electrical connection of the gate electrode to the cathode, the limits can also be influenced during operation.

With the proposed design of the monolithically integrated semiconductor switch, the problem of the underlying concept of DE 10 2016 207 859, in which the potential on the anode also lies at the gate potential of the p-JFET, can be solved. Thus, the maximum blocking resistance of the monolithically integrated semiconductor switch is no longer determined by the maximum voltage that can be applied to the gate electrode voltage, but rather by the dimensioning of the drift region in the field effect transistor. By appropriate choices for the thickness and doping of the drift region, monolithically integrated power circuit breakers can thus be implemented with the proposed design, with blocking resistances of up to 6.5 kV (silicon) or 100 kV (silicon carbide).

The proposed semiconductor switch can be used, for example, for providing security for electrical networks and systems. It is suitable for providing security for DC voltage installations, for example for energy transmission in buildings, or for supplying power to electrical drives from a DC voltage intermediate circuit, and also for other applications.

BRIEF DESCRIPTION OF THE FIGURES

In what follows the proposed semiconductor switch will be explained in more detail with the aid of embodiments in conjunction with the drawings. Here.

PATHS TO EMBODIMENT OF THE INVENTION

Figure 1:
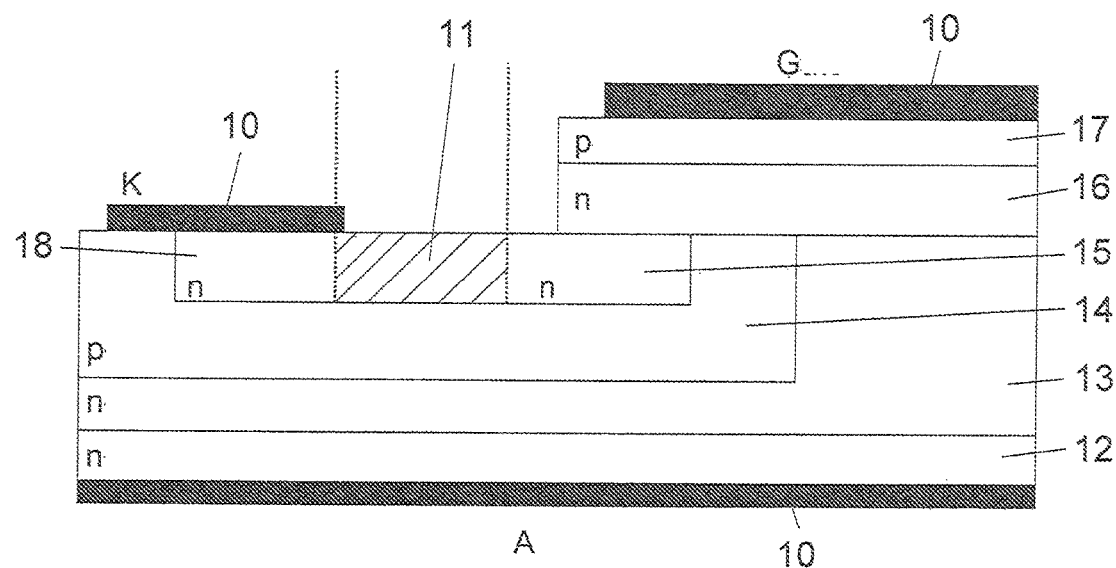
FIG. 1 shows a schematic representation of an example of the proposed semiconductor switch with an SiC-n-JFET with a lateral channel.

The proposed semiconductor switch has a monolithically integrated field effect transistor with a current-dependent series resistance, which is formed by a semiconductor structure with n-doped channels, which electrically connect the n-doped contact region to the source or emitter region of the field effect transistor and run between p-doped regions. To this end FIG. 1 shows the schematic representation of an example of the monolithic integration of the current-dependent series resistance in an SiC-n-JFET with a lateral channel. Here the n-JFET is monolithically integrated into an n-doped substrate 12 and has an n-doped contact region 18, an n-doped source region. 15 in a p-doped well 14, together with an n-doped channel 16, a p-doped gate region 17 and an n-doped drift region 13, as can be seen from FIG. 1. It is also possible to implement a self-conducting JFET by means of trench gates instead of p-type regions. The two electrical terminals of the semiconductor switch are formed by the metallisations 10 of the cathode K above the n-doped contact region 18 and the anode A on the rear face of the n-doped substrate 12. The semiconductor structure 11 between the n-doped source region 15 and the n-doped contact region 18 represents the current-dependent series resistance and is formed by n-doped channels 19 between p-doped regions 20. In what follows the n-doped channels 19 are also referred to as n-source strips, and the p-doped regions 20 as p-doped strips.

Figure 3:
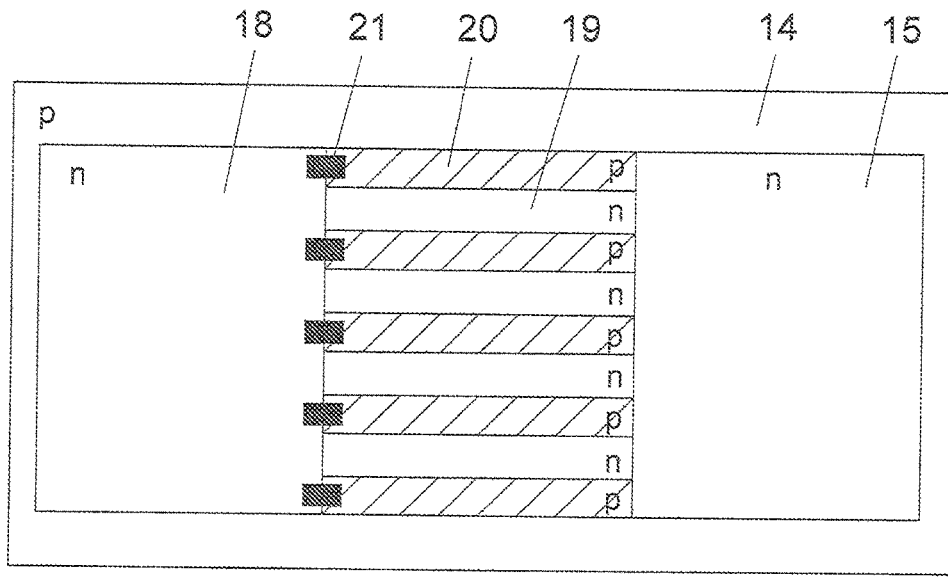
FIG. 3 shows in plan view an example of the configuration of the semiconductor region with the n-doped channels in the proposed semiconductor switch.

FIG. 3 shows a plan view of this exemplary embodiment of the semiconductor switch, in which the n-doped contact region 18, the n-doped source region 15 and the semiconductor structure forming the voltage-dependent series resistance are schematically illustrated within the p-well 14. The voltage-dependent series resistance consists of the n-source strips 19, which ohmically connect the n-doped source region 15 to the n-doped contact region 18, and p-doped strips 20, which in this example are ohmically connected by an ohmic layer 21 to the n-doped contact region 18. Here the p-doped strips 20 can be formed either by the p-well 14 itself, or by an additional epitaxial layer, or produced by an additional implantation.

Figure 2:
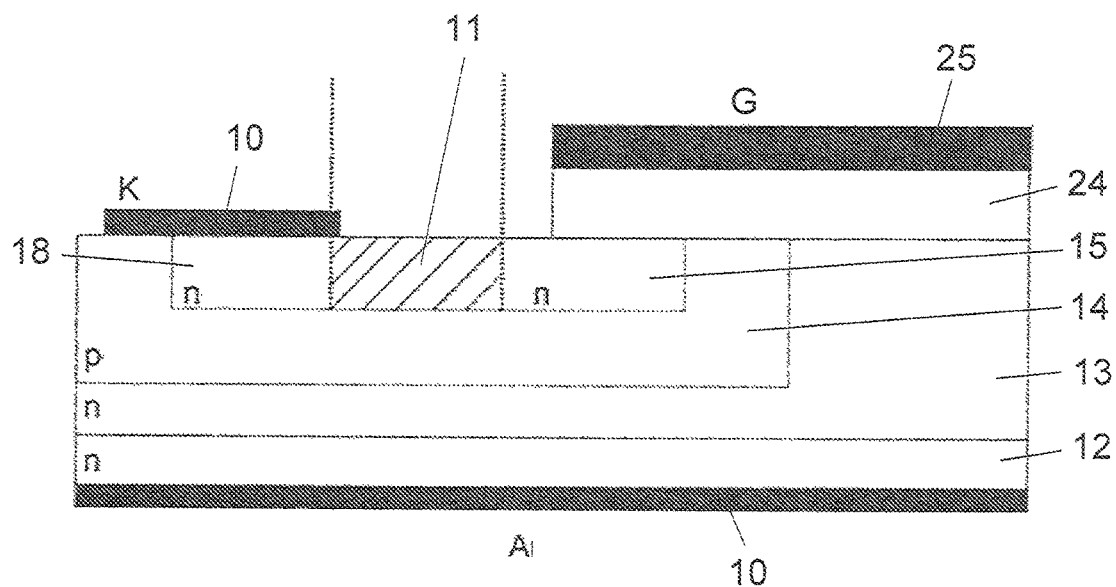
FIG. 2 shows a schematic representation of an example of the proposed semiconductor switch with a p-channel MOSFET.

FIG. 2 shows a schematic representation of another example of the proposed semiconductor switch, in which a normally non-conducting or conducting MOSFET is integrated instead of the n-JFET. The n-doped channel region 16 and the p-doped gate region 17 illustrated in FIG. 1 are replaced by an insulator 24 (gate oxide) and the gate electrode 10 is replaced by a polysilicon layer 25. The functional principle of the semiconductor switch of this embodiment is analogous to that of FIG. 1. In contrast to the latter, however, a gate drive is necessary when using a normally non-conductive MOSFET. At the same time this also allows an alteration of the activation current in normal operation.

Figure 4:
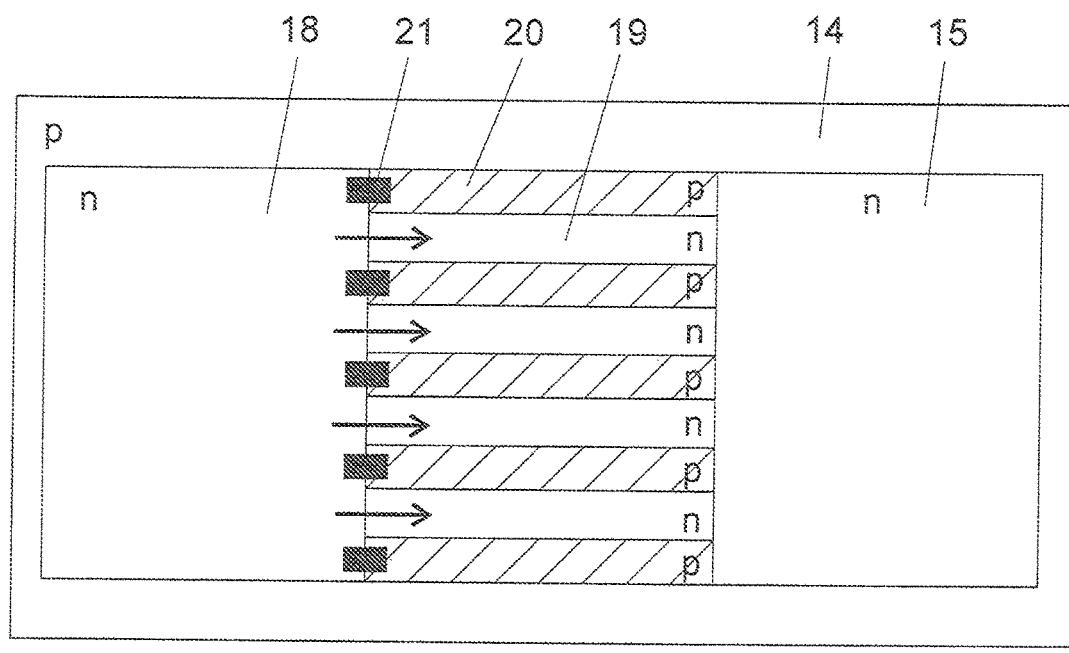
FIG. 4 shows a schematic representation of the current flow in the semiconductor structure of FIG. 3 in normal operation.
Figure 5:
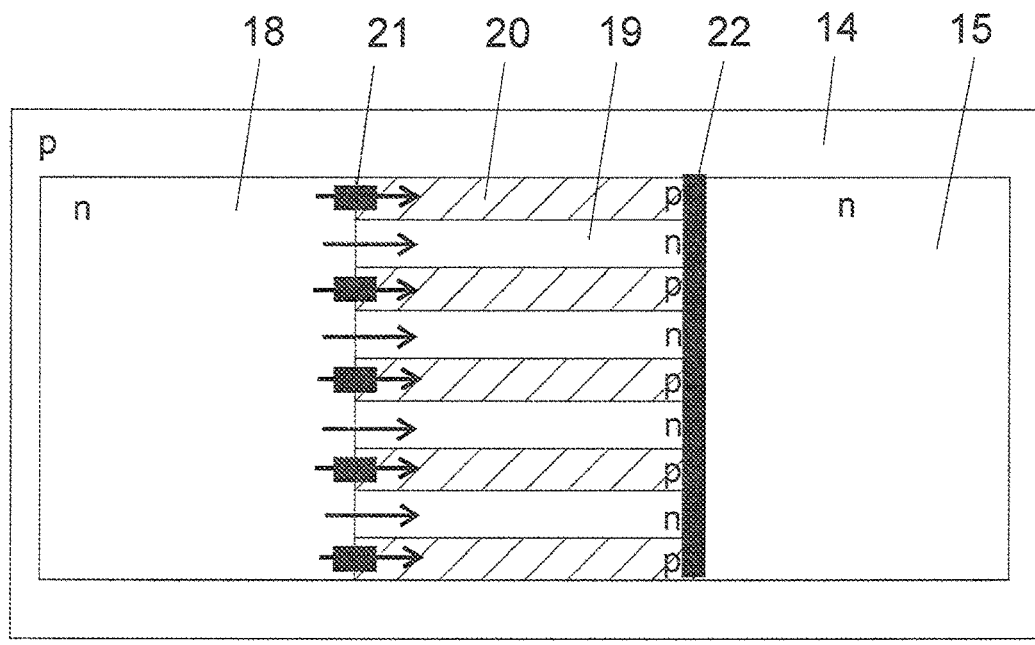
FIG. 5 shows in plan view a schematic representation of another embodiment of the semiconductor structure of the proposed semiconductor switch with the currents flowing in normal operation.

FIG. 4 shows schematically by means of arrows the electron current flowing in normal operation in the exemplary semiconductor switch of FIG. 1, from the n-doped contact region 18 to the n-doped source region 15. The current, indicated by the arrows in FIG. 4, flows through the n-source strips 19 and is thus determined solely by the voltage applied between the anode and cathode and the resistance of the n-source strips 19. The current through this series resistance can flow on directly into the n-JFET (electron current), so that no additional electrical connection is necessary to convert the hole current into an electron current. Compared to a p-JFET, a significant reduction of the "on"-resistance ensues as a result of the high conductivity of the n-doped layers compared to the conductivity of the p-doped SiC layers. This resistance lies in the range of a conventional n-JFET with a lateral channel region. Another significant advantage is the lower temperature dependence of the current through the n-JFET compared with a p-JFET. To increase the current carrying capacity further, the current through the p-doped regions 20 of the semiconductor structure 11 can also be used. To this end, the p-doped regions 20 must be bridged across to the n-doped source region 15 by a further metallisation (ohmic layer 22), as shown in FIG. 5. By this means, an at least partial compensation for the temperature dependencies of n-JFET and p-JFET in a certain temperature range is possible, so that the temperature dependence of the activation current can be reduced compared with that of a pure electron current. This figure also shows the corresponding currents, which are indicated by arrows, and in this example also use the p-doped regions 20 for the flow of current.

Figure 6:
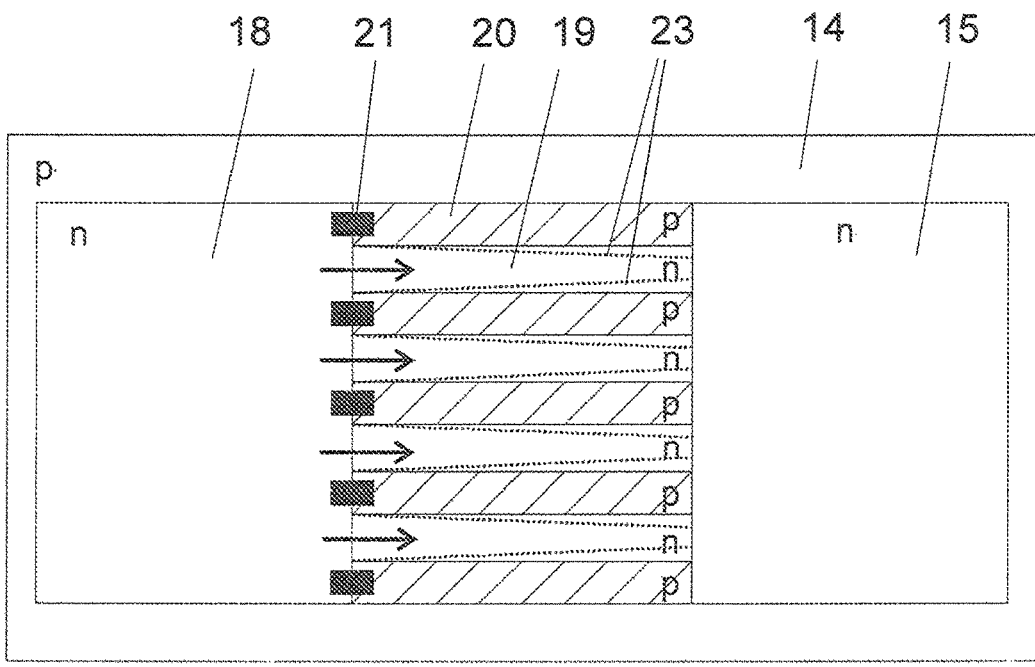
FIG. 6 shows a schematic representation of the current direction and the spread of the space charge zone in the semiconductor structure of FIG. 3 at currents above the rated current.

At currents above the rated current an additional voltage drop across the n-source strip 19, typical for junction field effect transistors, results in the proposed semiconductor switch. This leads to a pinch-off of the n-source strips 19 through a space charge zone 23, as shown in FIG. 6 by way of example. The current direction is again indicated by arrows. The pinch-off caused by the space charge zone 23 increases the resistance of the n-source strips 19, which leads to an increase in the voltage drop across the n-source strips 19 at a given current. Due to this voltage drop, however, the potential in the n-doped source region 15 also increases. This in turn leads to the potential difference between the p-doped gate region 17 (cf. FIG. 1) and the n-doped source region 15 becoming more negative. As a result of the negative potential difference between the n-doped source region 15 and the p-doped gate region 17, the width of the space charge zone between the p-doped gate region 17 and the n-doped channel region 16 increases, and the n-doped channel region 16 is pinched-off. If the voltage drop across the n-source strip 19 reaches the switch-off voltage of the n-JFET, the latter, and thus the entire load disconnector, is switched off. Studies of this arrangement by means of numerical modelling show that the load disconnector remains latched in the switched-off state.

An exemplary design of the strips 19, 20 is described below. For doping of the n-doped epitaxial layer, to form the n-source strips 19, $6*10^{15}/cm^3$ can be selected. If the p-doped strips 20 are now selected with a width of (for example) 3 μm and a doping of $5*10^{18}/cm^3$, the series resistance can then be adjusted by the spacing of the p-doped strips 20 from one another such that it becomes highly resistive at a selected pinch-off voltage (and the power circuit breaker opens). With a spacing of the p-doped strips 20 of 2 μm, the n-region (n-source strips 19) located between them is pinched-off from a voltage of approx. 10V. With a spacing of the p-doped strips 20 of 2.8 μm, 20V is already necessary for this purpose. If, with this n-type doping, the p-doped strips 20 are spaced apart by less than 1 μm, pinch-off already occurs at 0 V, and the power circuit breaker is always in blocking mode. For a functional component such dimensioning must be avoided.

For the use of the p-doped strips 20 for current conductivity, dimensioning must be undertaken such that both strips are emptied at (approximately) the same time. This methodology is of known art from charge compensation components such as "superjunction MOSFETs", LDMOS-transistors and the JTE-edge termination. Appropriate dimensioning instructions can be found in the relevant prior art.

Figure 7:
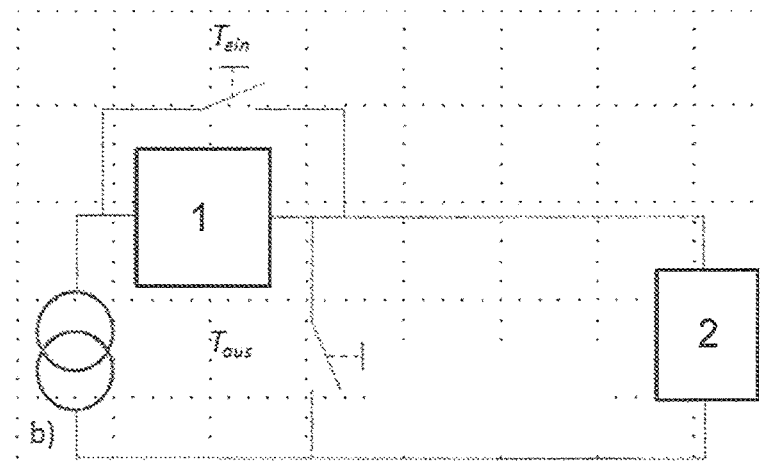
FIG. 7 shows an example of the use of the inventive power circuit breaker as a protective device for excess currents in a network application.
Figure 8:
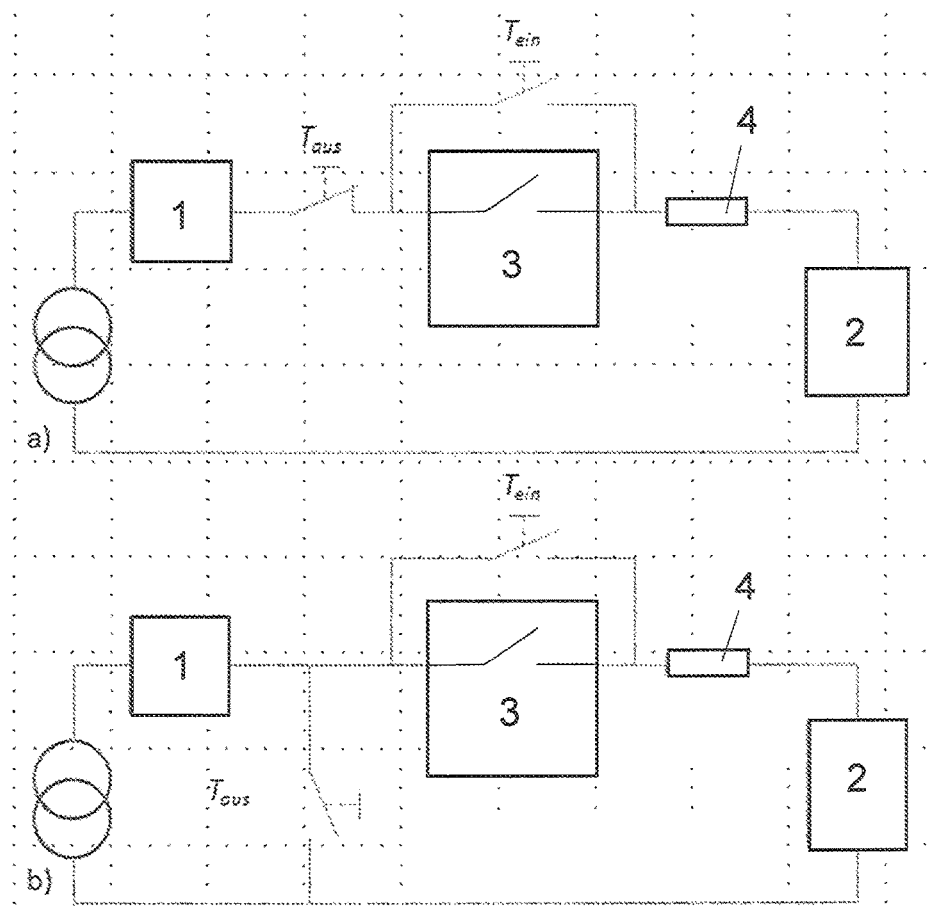
FIG. 8 shows an example of a use of the inventive power circuit breaker in a hybrid arrangement.

FIGS. 7 and 8 show exemplary applications of the inventive power circuit breaker as a protection circuit in an energy network. The integration into the network together with the embodiment of the "on"/"off" switches corresponds to the usual state of the art in the respective network (voltage level) and here are only embodied symbolically as switches $T_{on}/T_{off}$. FIG. 7 shows the proposed power circuit breaker 1 as a protective agent against excess currents (e.g. load short circuit) in a network application. The load 2 is also shown schematically in this figure.

The configuration shown in FIG. 8 with the proposed power circuit breaker 1 takes into account the need for a mechanical load disconnector in electrical energy transmission lines. On occasions this is required by law and ensures a mechanical separation of network and load 2. To this end, FIG. 8 shows a hybrid load disconnector consisting in this example of a mechanical or magnetic contactor 3 with a relay 4 and the proposed power circuit breaker 1. The load 2 is likewise again shown schematically in this figure. Sub-figure A shows the state with the "off"-switch $T_{off}$ opening; sub-figure B shows the state with the "off"-switch $T_{off}$ closing.

LIST OF REFERENCE SYMBOLS

1 Power circuit breaker
2 Load
3 Mechanical/magnetic contactor
4 Relay
10 Metallisation
11 Semiconductor structure
12 n-substrate/anode region
13 n-doped drift region
14 p-doped well region
15 n-doped source region
16 n-doped channel region
17 p-doped gate region
18 n-doped contact region 19 n-doped channel/strip
20 p-doped channel/strip
21 Ohmic layer
22 Ohmic layer
23 Space charge zone
24 Insulator
25 Polysilicon layer
A Anode
G Gate
K Cathode
$T_{on}$ Switch
$T_{off}$ Switch

The invention claimed is:

1. A semiconductor switch with a monolithically integrated field effect transistor, in which
an n-doped source or emitter region of the field effect transistor is electrically connected to a first electrical terminal, and a drain or collector region of the field effect transistor is electrically connected to a second electrical terminal of the semiconductor switch, in which
the source or emitter region of the field effect transistor is connected via a semiconductor region and an n-doped contact region to the first electrical terminal, and
a semiconductor structure with n-doped channels is formed in the semiconductor region between the n-doped contact region and the source or emitter region of the field effect transistor; the n-doped channels electrically connect the n-doped contact region to the source or emitter region of the field effect transistor, and run between p-doped regions that are connected within the semiconductor switch to the n-doped contact region.

2. The semiconductor switch in accordance with claim 1, characterised in that
the width of the n-doped channels is selected such that the semiconductor structure forms a current-dependent resistance between the first electrical terminal and the source or emitter region of the field effect transistor.

3. The semiconductor switch in accordance with claim 2, characterised in that,
the p-doped regions, between which the n-doped channels run, are connected via an ohmic connection to the n-doped contact region.

4. The semiconductor switch in accordance with claim 2, characterised in that,
the p-doped regions are connected via an ohmic connection to the source or emitter region.

5. The semiconductor switch in accordance with claim 3, characterised in that,
the p-doped regions are connected via an ohmic connection to the source or emitter region.

6. The semiconductor switch in accordance with claim 1, characterised in that,
the field effect transistor is an n-JFET, a MOSFET or a BIFET; the first electrical terminal is a cathode connection and the second electrical terminal is an anode connection.

7. The semiconductor switch in accordance with claim 1, characterised in that,
the p-doped regions, between which the n-doped channels run, are connected via an ohmic connection to the n-doped contact region.

8. The semiconductor switch in accordance with claim 7, characterised in that,
the p-doped regions are connected via an ohmic connection to the source or emitter region.

9. The semiconductor switch in accordance with claim 1, characterised in that,
the p-doped regions are connected via an ohmic connection to the source or emitter region.

10. The semiconductor switch in accordance with claim 1, characterised in that,
the field effect transistor is a BIFET with a p-doped anode region.

11. The semiconductor switch in accordance with claim 1, characterised in that,
the field effect transistor is monolithically integrated in a semiconductor substrate of silicon or silicon carbide.

* * * * *